(12) United States Patent
Ali (10) Patent No.: US 6,590,943 B1
(45) Date of Patent: Jul. 8, 2003

(54) RADIO RECEIVER

(75) Inventor: Danish Ali, South Croydon (GB)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 09/413,050

(22) Filed: Oct. 5, 1999

(30) Foreign Application Priority Data

Oct. 8, 1998 (GB) .............................................. 9821839

(51) Int. Cl.$^7$ .............................. H03D 3/22; H04L 27/22
(52) U.S. Cl. ...................... 375/332; 375/316; 455/130
(58) Field of Search ................................ 341/131, 143, 341/61, 155; 375/316, 215, 233, 332

(56) References Cited

U.S. PATENT DOCUMENTS

| | | | |
|---|---|---|---|
| 5,764,171 A | 6/1998 | Stikvoort | .................... 341/143 |
| 5,787,125 A | * 7/1998 | Mittel | ........................ 375/316 |

OTHER PUBLICATIONS

Jantzi et al. "Quadrature Bandpass Sigma–Delta Modulation for Digital Radio" IEEE Journal of Solid–State Circuits, vol. 32, No. 12, Dec. 1997.*

By S.A. Jantzi, K.W. Martin and Adel S. Sedra, "Quadrature Bandpass ΔΣ Modulation for Digital Radio", IEEE Journal of Solid–State Circuits. vol. 32, No. 12, Dec. 1997, pp. 1935 to 1950.

* cited by examiner

*Primary Examiner*—Stephen Chin
*Assistant Examiner*—Curtis Odom
(74) *Attorney, Agent, or Firm*—Dicran Halajian (57) ABSTRACT

A radio receiver has an input coupled to first and second quadrature related low-IF frequency translation stages generating IF signals at substantially half the channel bandwidth or channel spacing. The IF signals which may be optionally filtered in a pre-filter, for example a polyphase filter, are applied to first and second cross-coupled continuous time, low pass Sigma-Delta modulators. The modulators include transconductor-capacitor integrators, all but the first integrators of which are cross-coupled by gyrators set to resonate at the IF frequency. Outputs of the Sigma-Delta modulators include 1 bit oversampled signals. The oversampled signals may be filtered in first decimation stages which provide anti-aliasing. The decimated signals are derotated and decimated in a second decimation means to provide outputs at base band. The base band outputs are equalized and demodulated to provide an output. The input signal may be frequency translated to zero IF and then filtered in low pass filters.

18 Claims, 7 Drawing Sheets

RADIO RECEIVER

FIELD OF THE INVENTION

The present invention relates to a digital radio receiver or a receiver section of a radio transceiver and to integrated circuits embodying the digital radio receiver.

BACKGROUND OF THE INVENTION

An article entitled "Quadrature Bandpass ΔΣ Modulation for Digital Radio", IEEE Journal of Solid-State Circuits. Vol 32. No. 12, December 1997, pages 1935 to 1950, by S. A. Jantzi, K. W. Martin and Adel S. Sedra, mentions that a critical component in low-IF receiver architectures is one that performs bandpass analogue to digital conversion on quadrature signals. This article mentions a low IF variant of a direct conversion receiver having I and Q mixer outputs comprising narrow band signals at an IF. These outputs undergo complex, or quadrature, anti-alaising filtering and the outputs are then digitised in concert with a quadrature bandpass Sigma-Delta modulator. The modulator takes in a complex analogue input signal and produces a complex digital output which is representative of the complex input within a narrow bandwidth. The spectrum of the output, being complex, may be asymmetric about dc. Mathematical simulations of high order Sigma-Delta modulators do not always lead to stable implementations and in consequence are difficult to design.

FIG. 9 of this prior art article also discloses a quadrature bandpass Sigma-Delta modulator comprising several complex resonators. Each of the complex resonators is a simple complex filter which forms a complex pole on the unit circle. By having feedback around the quantizer, these poles form noise-shaping zeros responsible for nulling in-band quantization noise. FIG. 11 of this prior art article discloses a fourth order complex modulator having four complex poles inside a global feedback loop. The real and imaginary inputs are oversampled and the samples are supplied by way of respective capacitors to complex feed-ins of four complex resonators of the complex modulator. The real and imaginary channels each has a latched comparator that produces a one-bit output and drives a one-bit feedback digital to analogue converter DAC. The DAC output levels are fed back into the respective modulator stages through respective capacitors. The described structure allows independent positioning of all transfer function poles and zeros, which enables noise shaping to be performed at an arbitrary fraction of the sampling frequency and for noise-shaping zeros to be spread optimally across the band of interest. Optimal positioning of zeros within the band of interest significantly increases the signal-to-noise ratio (SNR) obtainable by a given modulator order. The described circuit has no provision for anti-alising which will occur due to the inputs to the Sigma-Delta modulator being sampled at the bit rate of the outputs from the latched comparators. By having the sampling before the loop filter, the loop filter cannot provide any anti-alising filtering which leads to interference from unwanted signals. The cited article discloses the provision of a complex anti-alias filter and amplifier to reduce this interference before the signals are applied to the Sigma-Delta modulator. This anti-alias filter has to have a high out-of-band attenuation and as a consequence it has a high power consumption and requires close matching. Such a filter if implemented as an integrated circuit migh require external (or off-chip) passive components.

United States of America Patent Specification U.S. Pat. No. 5,764,171 discloses a quadrature signal conversion device comprising frequency translation means for converting a received signal into frequency down converted quadrature related signals. Each of the quadrature related signals is supplied to a respective Sigma-Delta converter comprising a signal combining stage having inputs for one of the downconverted signals and for a signal fed back from an output of the Sigma-Delta converter. An output of the combining stage is coupled to an input of a filter stage, to which input is coupled the output of the filter stage of the other Sigma-Delta converter so that the Sigma-Delta converters are cross coupled thereby forming a polyphase filter. A quantiser is coupled to each of the filter stages to provide output signals suitable for processing in a digital signal processor (DSP) which produces the receiver's output signal. Using a single filter stage reduces the quantisation noise but there is a desire to reduce the quantisation noise further.

SUMMARY OF THE INVENTION

An object of the present invention is to be able to make an integratable receiver or receiver section of a transceiver with improved quantisation noise reduction.

According to a first aspect of the present invention there is provided a receiver comprising an input, first and second quadrature related frequency translation stages coupled to the input, first and second continuous time, low pass Sigma-Delta modulators coupled to the first and second frequency translation stages, respectively, for producing oversampled digital signals, the first and second Sigma-Delta modulators having a low frequency bandpass response, means for demodulating the digitised outputs, and means for altering the bit rate of the oversampled signals to a rate required by the demodulating means, wherein the first and second Sigma-Delta modulators each comprise a corresponding plurality of N serially connected integrators, where N is an integer having a value of at least 2, and wherein the second to Nth integrators of the first Sigma-Delta modulator are cross-coupled with the corresponding integrator of the second Sigma-Delta modulator.

By the first and second Sigma-Delta modulators being continuous time modulators, the sampling follows the loop filter thereby providing anti-alias filtering. Since the cross-coupled first and second Sigma-Delta modulators have a low frequency bandpass response matching is easier to achieve. Good matching is of importance because it is not easy to remove the error component of the wanted and interfering signal once it has been generated and also because of the effect on the quantisation noise spectrum. Since the cross-coupled modulators have a low frequency bandpass response they can be implemented as a low power integrated circuit. By not cross-coupling all the integrators, especially the first integrator, dc offsets are reduced.

BRIEF DESCRIPTION OF THE DRAWINGS

In an embodiment of the receiver, each of the Sigma-Delta converters includes a continuous time loop filter before the analogue-to-digital converter (ADC) in order to pass the wanted signal band but apply heavy attenuation to signals at frequencies higher than half the sampling rate thereby avoiding aliasing.

The first and second quadrature related frequency translation stages may be low IF or, alternatively, zero IF stages.

A pre-filter, for example a polyphase filter, may be coupled between a respective output of each of the first and second frequency translation stages and a respective one of the first and second Sigma-Delta modulators. The provision of the pre-filters provides low order anti-aliasing filtering and blocking suppression which avoids the Sigma-Delta modulators having to block signals which it is estimated could require an increase in its dynamic range and a very substantial increase line rate.

Automatic gain control means may be coupled between a respective output of each of the first and second frequency translation stages, operating as low IF stages, and the Sigma-Delta modulators. An advantage of providing gain control is that it reduces the dynamic range of the Sigma Delta modulators further.

When the first and second frequency translation stages are zero IF stages, the products of mixing are applied to low pass filters.

The bit rate altering means may comprise at least one decimating means.

In an embodiment of the present invention the oversampled outputs of the first and second Sigma-Delta modulators are applied to first decimating means coupled to outputs of the modulators for reducing the sampling rate thereby reducing the noise power, derotation means are coupled to the first decimating means, the derotation means producing a relatively pure sine wave signal thereby preventing large out-of-band quantisation noise from being aliased in band, and second decimating means are coupled to the derotation means for reducing the sampling rate further.

The first decimating means may be cross coupled in order to give bandpass noise shaping at the low IF thereby reducing the need for a higher over-sampling factor.

According to a second aspect of the present invention there is provided an integrated circuit comprising a receiver in accordance with the first aspect of the present invention.

BRIEF DESCRIPTION OF THE DRAWINGS

The present invention will now be described, by way of example, with reference to the accompanying drawings, wherein.

In the drawings the same reference numerals have been used to indicate corresponding features.

DETAILED DESCRIPTION OF THE INVENTION

For convenience of description the present invention will be described with reference to the GSM (Global System for Mobile Communications) digital cellular telephone standard.

Figure 1:
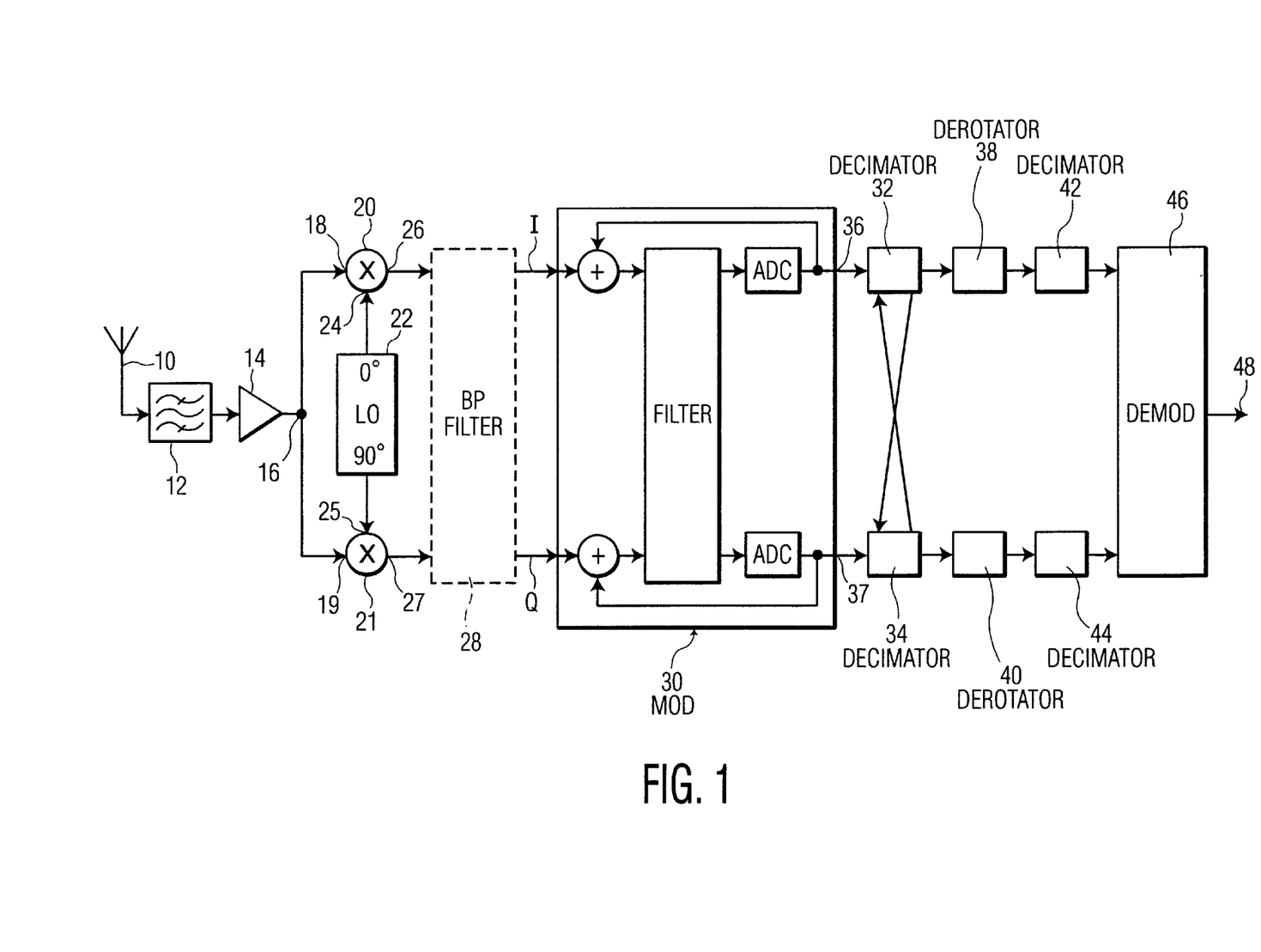
FIG. 1 is a block schematic diagram of one embodiment of a receiver made in accordance with the present invention.

Referring to FIG. 1, the receiver (or receiver section) comprises an antenna 10 coupled to a low noise RF amplifier 14 by way of a bandpass filter 12 which selects signals in the GSM band of 925 to 960 MHz. The signal from the amplifier 14 is split at a node 16 and supplied to first inputs 18, 19 of balanced mixers 20, 21. Quadrature related local oscillator signals having a frequency offset by 100 kHz (or half a channel) from the centre frequency of the received signal are supplied by a signal generator 22 to second inputs 24, 25 of the mixers 20, 21. Real and imaginary outputs 26, 27 of the mixers 20, 21, respectively, are supplied to cross coupled, continuous time, low pass Sigma Delta modulators 30 to be described in greater detail with reference to FIG. 2. Optionally a bandpass pre-filter 28 for blocking suppression is connected in the signal paths from the outputs 26, 27 of the mixers 20, 21. If desired a measure of automatic gain control may be applied to outputs of the pre-filter 28. The input signals to the Sigma-Delta modulators 30 are in-phase (I) and quadrature (Q) IF signals at 100 kHz and the outputs are oversampled 1-bit digital signals at 13 MHz.

Cross coupled, first decimation stages 32, 34 are coupled to the in-phase (I) and quadrature (Q) outputs 36, 37, respectively, of the cross coupled, low pass Sigma-Delta modulators 30. The stages 32, 34 provide anti-alias bandpass filtering and a reduction in the sampling rate by, in the present embodiment, a factor of 6. The outputs from the first decimation stages 32, 34 are at 2.17 MHz. The signals from the first decimation stages 32, 34 are derotated in derotation stages 38, 40. Second decimating stages 42, 44 are coupled to the derotation stages 38, 40, respectively, and reduce the sampling rate by, in this embodiment, a factor of 8 to provide signals at 270.83 kHz, the bit rate of GSM. Outputs from the second decimating stages 42, 44 are supplied to an equaliser/demodulator stage 46 which provides an output 48.

The operation of the receiver shown in FIG. 1 may be summarised by the incoming RF signal from the antenna 10 is converted in the balanced mixers 20, 21 into in-phase (I) and quadrature (Q) components at a low IF equal to typically half the channel bandwidth or half the channel spacing. These I and Q signals are digitised using a pair of low-pass Sigma-Delta modulators 30 which have been cross-coupled in order to shift the noise shaping minimum from zero to the low IF in use. The bitstream output from the Sigma-Delta modulators 30 is then decimated and derotated to provide a multi-bit digitised zero-IF output, the majority of the adjacent channel filtering having been done in the decimation process. The multi-bit output is then demodulated as appropriate for the application.

Figure 2:
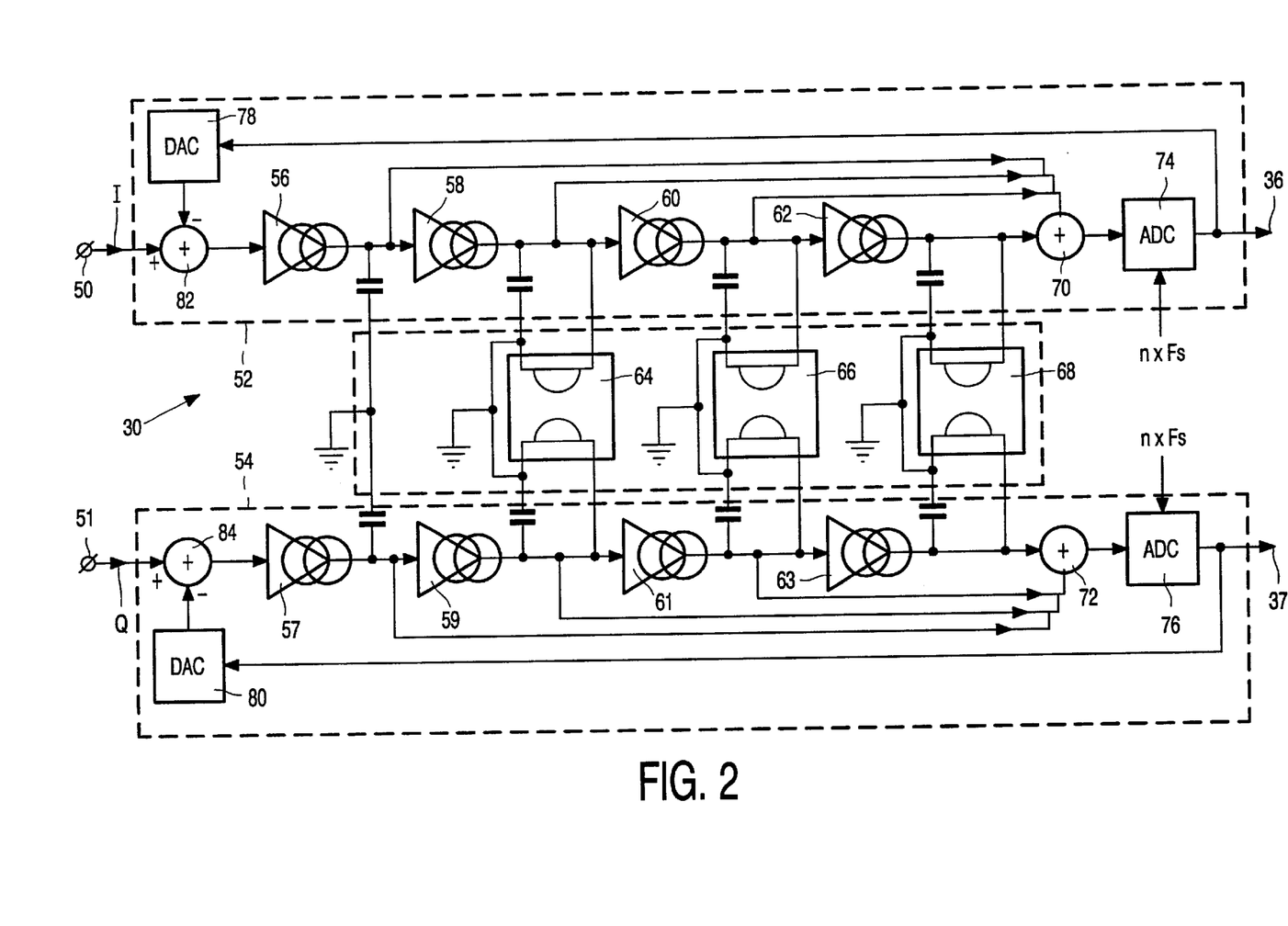
FIG. 2 is a block schematic diagram of the cross coupled Sigma-Delta modulators implemented using transconductor-capacitor integrators.

FIG. 2 illustrates the cross coupled, continuous time, low pass Sigma-Delta Modulators 30 in greater detail. Quadrature related analogue low IF signals I and Q are applied respectively to input terminals 50, 51. Each input terminal 50, 51 is coupled to a fourth-order, time-continuous, Sigma-Delta modulator 52, 54. Each modulator 52, 54 comprises an anti-alias continuous time analogue loop filter consisting of four series connected transconductor capacitor integrators 56, 58, 60, 62 and 57, 59, 61, 63. The second to fourth integrators of each modulator are cross-coupled by gyrators 64, 66, 68. Each stage is set to resonate at a respective frequency in the IF band; the frequency being determined in accordance with the ratio $g_m/C$. The value of C is set by the noise requirements and conductance $g_m$ is set to give the desired centre frequency for that value of C. Cross coupling these stages has the effect of introducing a negative susceptance at each capacitor site whose value is determined by the shift in frequency required and the characteristic admittance of the gyrator. The first stages 56, 57 are not cross-coupled using a gyrator which avoids introducing a dc offset to the outputs of these stages. Outputs of each of the four stages 56, 58, 60, 62 and 57, 59, 61, 63 are combined in respective summation stages 70, 72. Outputs of the stages are applied to respective 1-bit analogue-to-digital converters (ADC) 74, 76 in which the analogue signals are oversampled to provide 1 bit signals at 13 MHz on the outputs 36, 37, respectively. By choosing a high over-sampling ratio, that is, the higher the number of samples over which the average can be made, the better will be the effective resolution of the ADC.

The outputs of the ADCs 74, 76 are also fed back, converted into analogue signals in 1 bit DACs 78, 80, and combined in summation stages 82, 84 with signals on the respective input terminals 50, 51. The feed back loops ensure that, in the frequency band of interest, the average value of the quantisation noise produced by the ADCs 74, 76 is as small as possible, to make the averaging process worthwhile.

Figure 3:
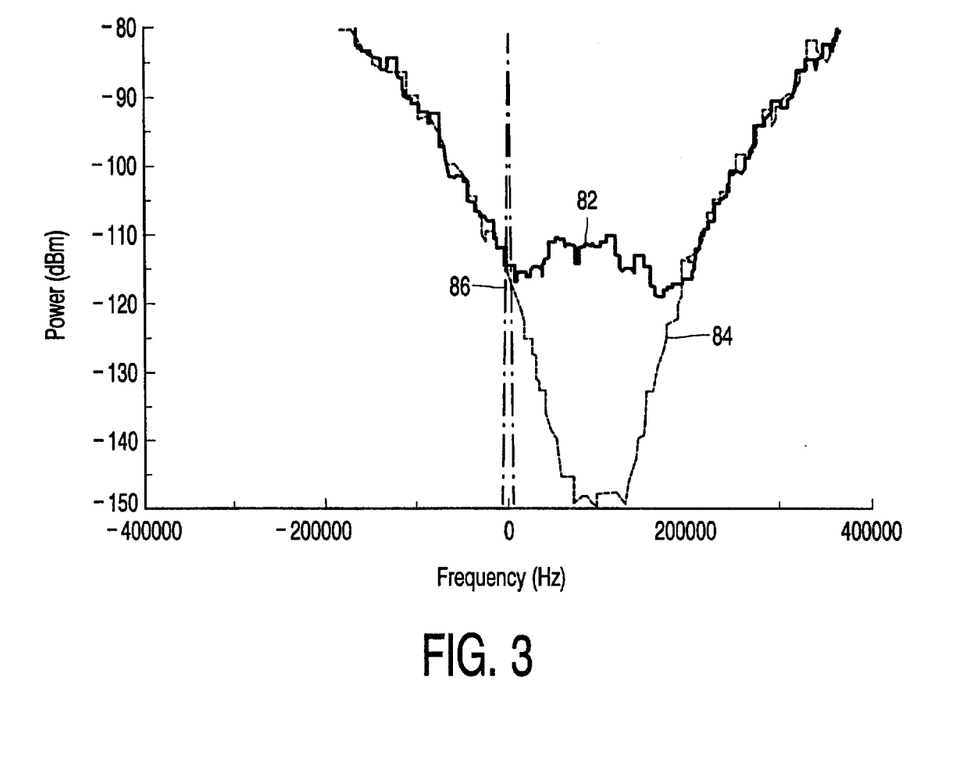
FIG. 3 is graph of frequency in Hertz versus power in dBm showing the cross-coupled Sigma-Delta modulator signal and noise at a 13 MHz sample rate.

By running the cross-coupled Sigma-Delta modulators at the sampling rate of 13 MHz with all the gyrators 64, 66, 68 set to resonate at respective frequencies in the vicinity of 100 kHz, the signal and quantisation noise spectra are as shown in FIG. 3. In FIG. 3 the continuous line 82 shows a GSM GMSK signal plus noise characteristic, the dotted line 84 illustrates the ADC noise floor and the broken line 86 indicates the DC noise. By choosing a low IF of 100 kHz the wanted GSM GMSK signal has been moved away from the DC noise spike 86. Additionally by reducing the clock rate to an acceptable value to save power, the GSM GMSK is well above the noise floor 84 over the whole of the 200 kHz bandwidth of the wanted signal.

Figure 4:
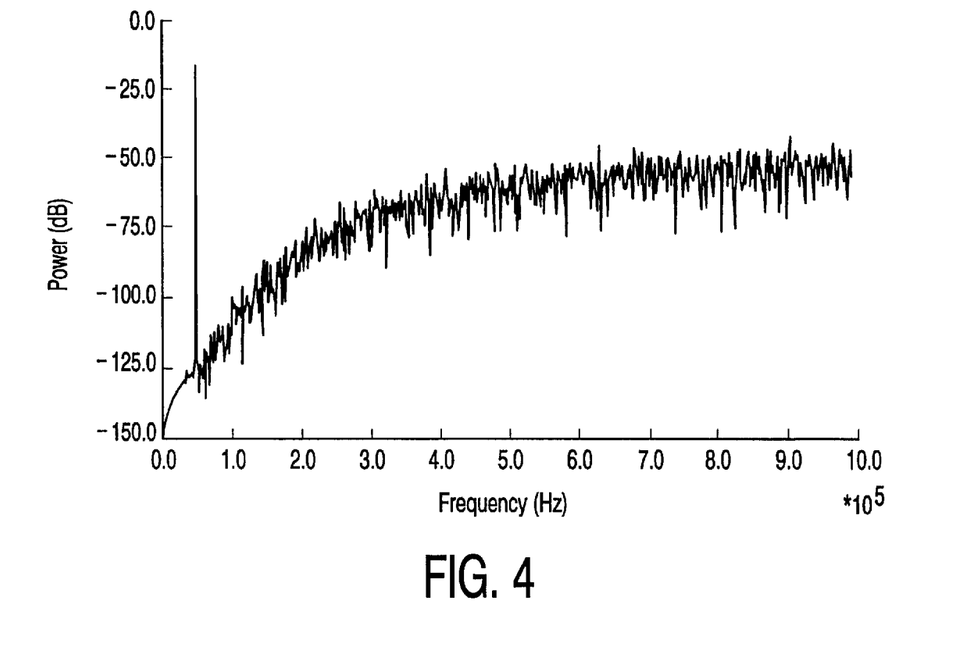
FIG. 4 is the frequency spectrum (frequency versus power) of the raw output from a Sigma-Delta modulator.

The bit streams on the outputs 36, 37 of the Sigma-Delta modulators are applied to the first decimation stages 32, 34 which reduce the sample rate, reduce the very high levels of noise produced by the Sigma-Delta modulators outside the wanted signal bandwidth and provide the majority of the receiver's channel selectivity. In order to have an indication of the sort of filtering involved, reference is made to FIG. 4 which shows the frequency spectrum from a fourth-order, low pass Sigma-Delta modulator fed with an input signal at maximum.power. For convenience of representation, the spectrum corresponds to the use of a zero IF rather than a low IF. The signal frequency is at 50 kHz and the ADC sampling frequency is 13 MHz. Examination of the frequency spectrum illustrates the noise shaping action of the loop filter in the modulator by the fact that there is an absence of noise at low frequencies below 50 kHz and a great deal of noise at higher frequencies.

Figure 5:
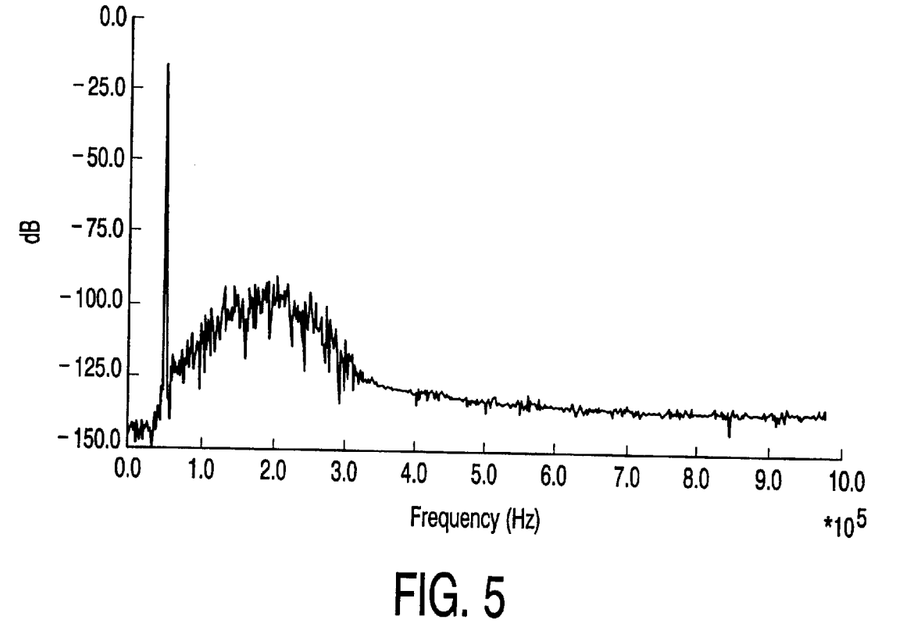
FIG. 5 is the frequency-spectrum (frequency versus power) after the first stage of decimation.

FIG. 5 is a frequency spectrum of the signal at the output of a first decimation stage in which the sampling rate of 13 MHz has been reduced by a actor of 6 to a rate of 2.17 MHz. It can be seen that the filter formed by the first decimation stage has reduced the noise power to the extent that the signal to noise ratio is +60.8 dB.

Figure 6:
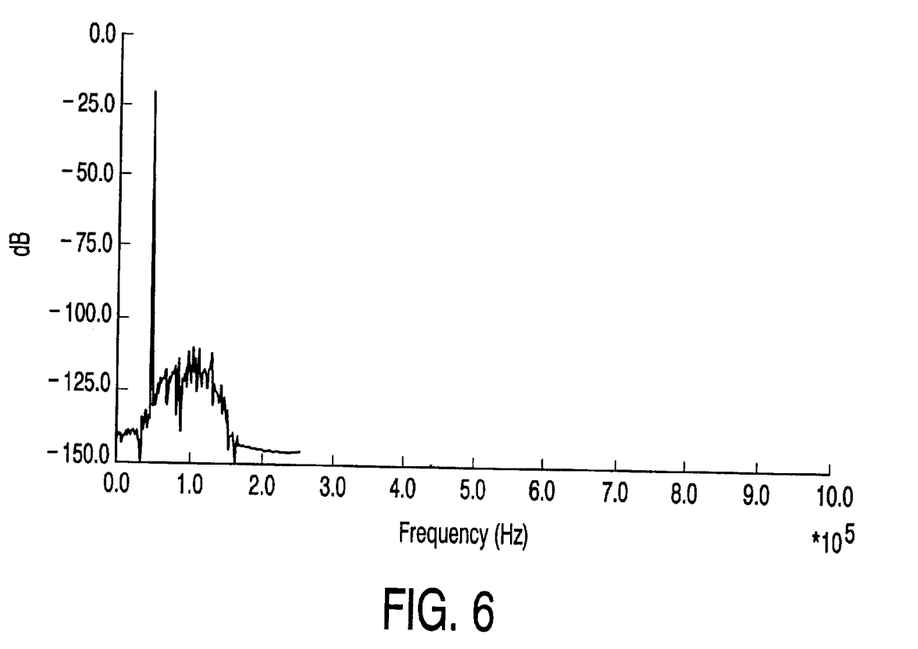
FIG. 6 is signal and noise spectrum (frequency versus power) after the second stage of decimation.

FIG. 6 is a frequency spectrum of the signal at the output of the second decimation stage. A decimation factor of 8 is used to reduce the sampling rate of 270.833 ksamples/sec. The filtering is more accurately controlled because this stage is largely responsible for providing channel selectivity. Integration of the noise power reveals that the signal-to-noise ratio has now increased to +82 dB.

In connection with locating the derotation stages 38, 40 (FIG. 1) between the first and second decimation stages, large out-of-band quantisation noise must not be aliased in-band so the derotation signal, effectively a local oscillator signal at −100 kHz, must be a relatively pure sine wave. A large word width is therefore needed to code the sine wave which will have an adverse effect on the power consumption of the digital signal processing unless the sampling rate has been reduced significantly. Derotation cannot be postponed until after all of the decimation has been completed because the sampling rate is then too low to encode the signal without aliasing.

The decimation of the 13 MHz signal can be done in any suitable way provided that the derotation can be effected satisfactorily. For example the factors of 6 and 8 could be say 24 and 2 respectively or 4 and 12 respectively. Also such factors can be achieved in one or more stages, for example a factor of 6 can be implemented as ÷2 and ÷3. Using two or more stages may lead to a saving of power. The overall decimation factor is determined to get the bit rate to a rate required by the equaliser/demodulator stage 46.

In a non-illustrated embodiment of the invention, the equaliser/demodulator stage 46 may be so designed that separate derotation of the bit streams is unnecessary with the result that the bitstreams are decimated and supplied direct to the stage 46.

Figure 7:
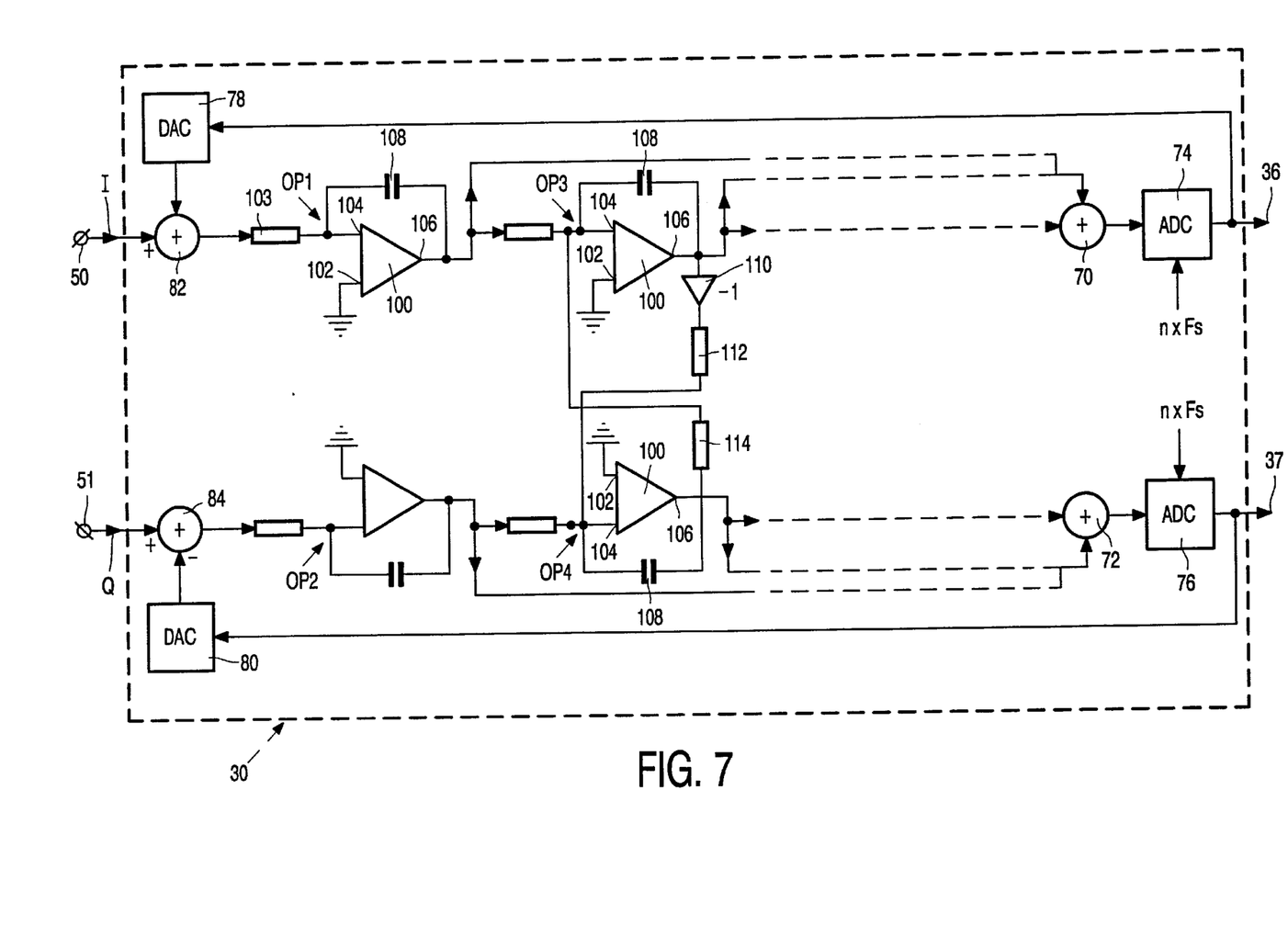
FIG. 7 is a block schematic diagram of a cross-coupled Sigma-Delta modulators implemented using op-amp filters.

FIG. 7 illustrates the cross coupled, continuous time, low pass Sigma-Delta modulators 30 implemented using op-amp filters OP1, OP2, OP3 and OP4. The filters are of similar construction and in the interests of brevity the filter OP1 will be described in detail. An op-amp 100 has one input 102 connected to ground. A resistor 103 is connected to a second input 104 of the op-amp. A feedback capacitor 108 is coupled between an output 106 of the op-amp 100 and the second input 104.

Op-amp filters OP3 and OP4 are shown cross coupled. This is effected by the output 106 of the op-amp of the filter OP3 being coupled to the second input 104 of the op-amp of the filter OP4 by serially connected inverting amplifier 110 and resistor 112. A resistor 114 couples the output 106 of the op-amp of the filter OP4 to the second input of the op-amp of the filter OP3.

The operation of the cross coupled Sigma-Delta modulator 30 is the same as described with reference to FIG. 2 and in the interests of brevity, the description will not be repeated.

Figure 8:
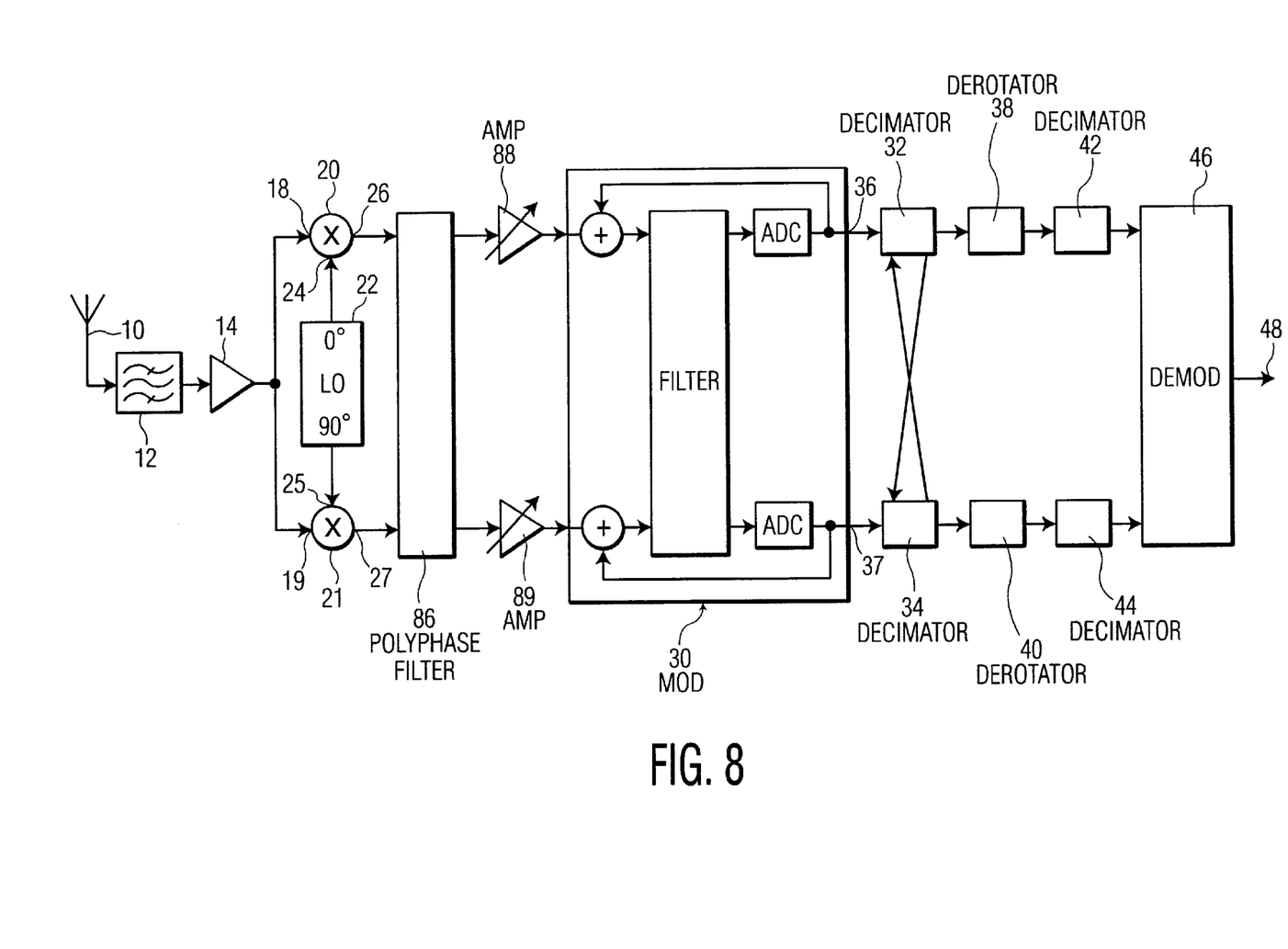
FIG. 8 is a block schematic diagram of a second embodiment of a receiver made in accordance with the present invention.

FIG. 8 illustrates a second embodiment of a low IF receiver in which the products of mixing in the quadrature related mixers 20, 21 are applied to an analogue polyphase filter 86 having a measure of automatic gain control (agc) provided by adjustable gain amplifiers 88, 89. The polyphase filter 86 is able to block unwanted image signals but pass the wanted signals. The cross coupling in the Sigma-Delta modulator 30 using gyrators, as shown in FIG. 2 or resistors, as shown in FIG. 7, increases the dynamic range of the converter. In this embodiment the sampling frequency of the ADC is 6.5 MHz and as a consequence decimation factors for the decimators 32, 34 and 42, 44 are say 3 and 8, respectively, but other combinations of factors are possible. The circuit illustrated in FIG. 8 is otherwise similar to that shown in FIG. 1 and in the interests of brevity will not be described again.

Figure 9:
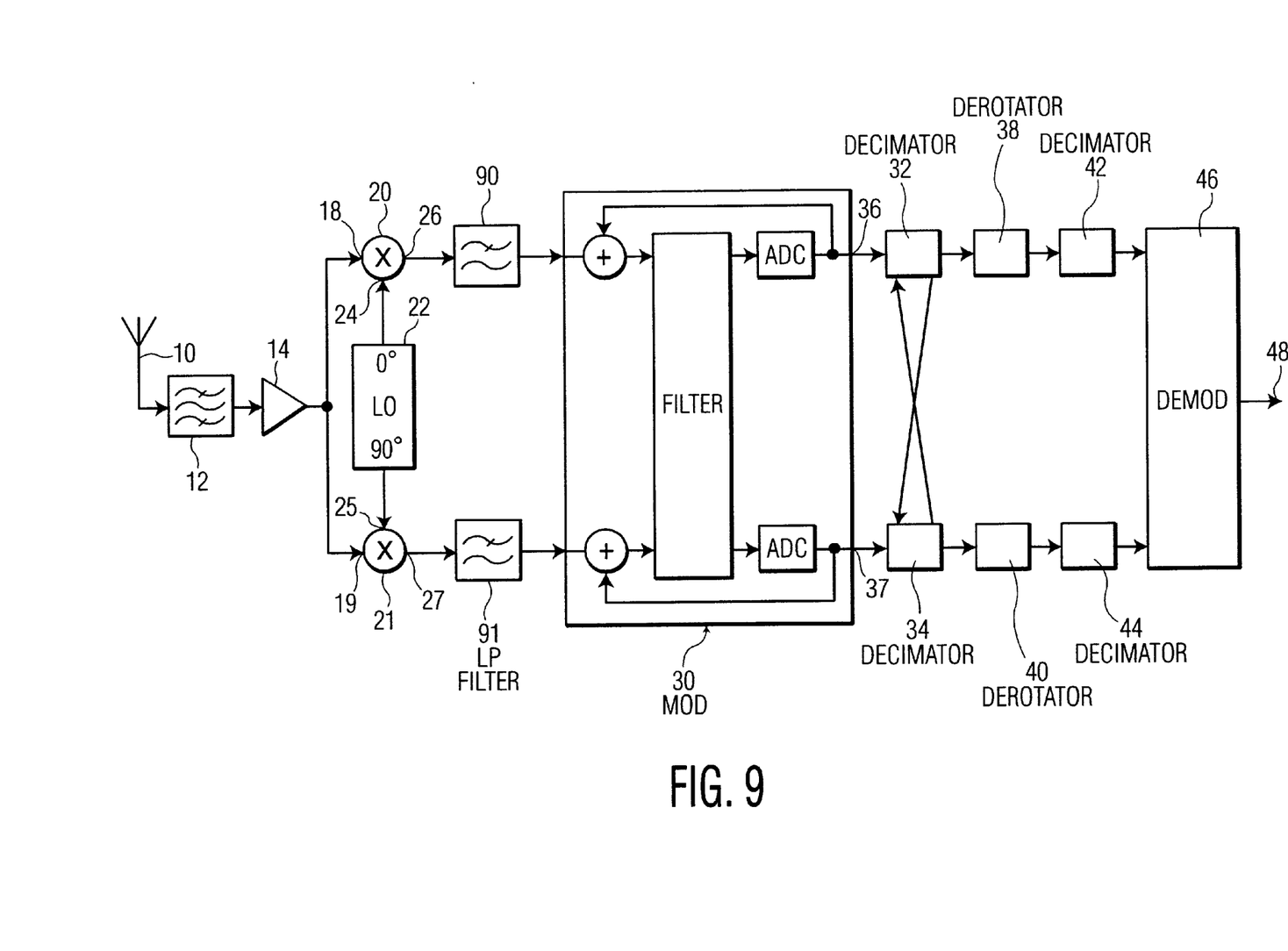
FIG. 9 is a block schematic diagram of a third embodiment of a receiver made in accordance with the present invention.

FIG. 9 illustrates a third embodiment of the present invention in which the receiver is configured and operated as a zero IF receiver. In this embodiment the local oscillator 22 provides quadrature related local oscillator signals at the nominal carrier frequency of the received signal and the products of mixing are applied to low pass filters 90, 91 to select the zero IF I and Q signals.

By the Sigma-Delta modulators being cross coupled it is possible to realise the desired filtering characteristic without having to provide resonators in the feedback paths from the ADCs 74, 76 (FIG. 2), such resonators normally being difficult to realise in practice.

The circuit illustrated in FIG. 9 is otherwise similar to that shown in FIG. 1 and in the interests of brevity will not be described again.

When implementing the receivers shown in FIGS. 1, 8 and 9, the blocks up to and including the Sigma Delta modulators are fabricated in a high frequency analogue process thereby maintaining a high linearity and low noise. The first and second decimation stages and the derotation stages are best done in hardware fabricated in a digital CMOS process.

Mismatches between the transfer functions of the I and Q signal paths will generally be as a result of processing variations in the fabrication of analogue parts of the receiver. However the effects of mismatches are reduced by using an IF which is less than the width of the channel or channel spacing such that the image channel is an adjacent channel with its lower interference immunity requirement.

In the present specification and claims the word "a" or "an" preceding an element does not exclude the presence of a plurality of such elements. Further, the word "comprising" does not exclude the presence of other elements or steps than those listed.

From reading the present disclosure, other modifications will be apparent to persons skilled in the art. Such modifications may involve other features which are already known in the design, manufacture and use of receivers and component parts therefor and which may be used instead of or in addition to features already described herein.

What is claimed is:

1. A receiver comprising an input, first and second quadrature related frequency translation stages coupled to the input, first and second continuous time, low pass Sigma-Delta modulators coupled to the first and second frequency translation stages, respectively, for producing oversampled digital signals, the first and second Sigma-Delta modulators having a low frequency bandpass response, means for demodulating the digitised outputs, and means for altering the bit rate of the oversampled signals to a rate required by the demodulating means, the bit rate altering means comprising first decimating means coupled to outputs of the first and second Sigma-Delta modulators, derotation means coupled to the first decimating means, and second decimating means coupled to the signal derotation means, wherein the first and second Sigma-Delta modulators each comprise a corresponding plurality of N serially connected integrators, where N is an integer having a value of at least 2, and wherein the second to Nth integrators of the first Sigma-Delta modulator are cross-coupled with the corresponding integrator of the second Sigma-Delta modulator.

2. A receiver as claimed in claim 1, wherein the first decimating means are cross-coupled.

3. A receiver as claimed in claim 1, wherein the derotation means is adapted to provide a digital word representative of a substantially pure sine wave.

4. A receiver as claimed in claim 1, wherein the first and second frequency translation stages are low IF stages.

5. A receiver as claimed in claim 4, wherein a pre-filter couples a respective output of each of the first and second frequency translation stages to a respective one of the first and second Sigma-Delta modulators.

6. A receiver as claimed in claim 5, further comprising an automatic gain control means which is coupled between each of the first and second frequency translation stages and the first and second Sigma-Delta modulators.

7. A receiver as claimed in claim 1, wherein the first and second frequency translation stages are zero IF stages, and wherein low pass filters couple the first and second frequency translation stages to the first and second Sigma-Delta modulators.

8. An integrated circuit comprising a receiver as claimed in claim 1.

9. A receiver comprising:
first and second frequency translation stages that receive an input and output a first frequency translated signal and a second frequency translated signal;
a first modulator coupled to the first frequency translation stage to receive said first frequency translated signal and output a first modulated signal;
a second modulator coupled to the second frequency translation stage to receive said second frequency translated signal and output a second modulated signal;
a demodulator which demodulates said first and second modulated signals; and
a rate altering circuit which alters a bit rate of said first and second modulated signals to a rate required by said demodulator;
wherein said rate altering circuit includes a first decimator circuit coupled to outputs of the first and second modulators, a signal derotator circuit coupled to the first decimator circuit, and a second decimator circuit coupled to the signal derotator circuit.

10. A receiver as claimed in claim 9, wherein the first decimator circuit includes first and second decimators which are cross-coupled.

11. A receiver as claimed in claims 9, wherein the signal derotator circuit is adapted to provide a digital word representative of a substantially pure sine wave.

12. A receiver as claimed in claim 9, wherein the first and second frequency translation stages are low IF stages.

13. A receiver as claimed in claim 9, further comprising a pre-filter which couples a respective output of each of the first and second frequency translation stages to a respective one of the first and second modulators.

14. A receiver as claimed in claim 9, further comprising automatic gain control means coupled between each of the first and second frequency translation stages and the first and second modulators.

15. A receiver as claimed in claim 9, wherein the first and second frequency translation stages are zero IF stages and wherein low pass filters couple the first and second frequency translation stages to the first and second modulators.

16. An integrated circuit comprising a receiver as claimed in claim 9.

17. A receiver comprising:
first and second frequency translation stages that receive an input and output a first frequency translated signal and a second frequency translated signal;
a first modulator coupled to the first frequency translation stage to receive said first frequency translated signal and output a first modulated signal;
a second modulator coupled to the second frequency translation stage to receive said second frequency translated signal and output a second modulated signal; and
a demodulator which demodulates said first and second modulated signals;
wherein the first and second modulators each comprise a corresponding plurality of N serially connected integrators, where N is an integer having a value of at least 2, a second to Nth integrators of the first modulator being cross-coupled with a corresponding integrator of the second modulator while a first of said integrators of the first modulator is not cross-coupled with a corresponding integrator of the second modulator.

18. A receiver as claimed in claim 17, further comprising a rate altering circuit which alters a bit rate of said first and second modulated signals to a rate required by said demodulator.

* * * * *